United States Patent [19]

Matsumoto et al.

[11] Patent Number: 4,939,536

[45] Date of Patent: Jul. 3, 1990

[54] THERMAL FIXING DEVICE IN AN IMAGE RECORDING APPARATUS

[75] Inventors: Yumio Matsumoto, Kasugai; Osamu Takagi, Nagoya, both of Japan

[73] Assignee: Brother Kogyo Kabushiki Kaisha, Aichi, Japan

[21] Appl. No.: 222,577

[22] Filed: Jul. 21, 1988

[30] Foreign Application Priority Data

Jul. 21, 1987 [JP] Japan .................................. 62-182806
Sep. 25, 1987 [JP] Japan .................................. 62-241073

[51] Int. Cl.$^5$ ............................................ G03B 27/32
[52] U.S. Cl. ............................................ 355/27; 355/30
[58] Field of Search .................... 355/26, 27, 100, 106, 355/282, 283, 285, 286, 287, 288, 289; 219/216; 251/11

[56] References Cited

U.S. PATENT DOCUMENTS

| | | | |
|---|---|---|---|
| 3,403,238 | 9/1968 | Buehler et al. | 251/11 |
| 3,792,964 | 2/1974 | Chatterji | 355/286 |
| 4,021,107 | 5/1977 | Morita | 355/286 |
| 4,687,315 | 8/1987 | Fujii | 355/285 |

FOREIGN PATENT DOCUMENTS 58-17432 2/1983 Japan .

Primary Examiner—L. T. Hix
Assistant Examiner—Khanh Dang
Attorney, Agent, or Firm—Oliff & Berridge

[57] ABSTRACT

An image recording apparatus disclosed herein is capable of recording a color image with the use of a photosensitive and pressure-sensitive recording sheet. A latent image is formed on the recording sheet by exposing light emitted from an exposure light source. The latent image formed thereon is subjected to a pressure developement to provide a visible image on a color developer sheet. The visible image is then thermally fixed by a thermal fixing device which comprises a heat storing-/radiating means for storing heat generated by the exposure light source and radiating the heat stored therein toward the color developer sheet. The heat storing-/radiating means is disposed between the exposure light source and the developer sheet on which the visible image is formed to be in substantial contact with the color developer sheet, whereby no separate heat source is necessary for heating the color developer sheet.

19 Claims, 2 Drawing Sheets

THERMAL FIXING DEVICE IN AN IMAGE RECORDING APPARATUS

BACKGROUND OF THE INVENTION

The present invention relates generally to an image recording apparatus for recording a color image on a color developer sheet with the use of a photosensitive and pressure sensitive recording sheet, in which a latent image formed on the photosensitive and pressure-sensitive recording sheet is subjected to a pressure development to provide a visible image on the color developer sheet. More particularly, the invention relates to a thermal fixing device in such an image recording apparatus for thermally fixing the developed visible image on the color developer sheet.

A recording sheet applicable to the image recording apparatus of the invention is disclosed in Japanese Laid-Open Patent Publication No. 58-17432. The recording sheet disclosed therein is in the form of a photosensitive and pressure-sensitive recording sheet coated on one surface with photocuring microcapsules encapsulating dye precursors. An image on n image carrying sheet is recorded on the photosensitive and pressure-sensitive recording sheet as a latent image. The latent image is formed in such a way that microcapsules are selectively photocured corresponding to the image on the image carrying sheet upon exposure to light emitted from an exposure light source and bearing image information. A color developer sheet is then superposed on the recording sheet with the latent image formed thereon, and the two sheets are pressed by a pair of pressure developing rollers. Those microcapsules which have not been photocured are ruptured by the application of pressure, thereby allowing the dye precursors to flow out of the ruptured microcapsules and react with the color developer coated on the color developer sheet Thus, the latent image formed on the photosensitive and pressure-sensitive recording sheet is transferred onto the color developer sheet. The transferred image is then thermally fixed with heat applied to the color developer sheet.

Thermal fixing is carried out in order to speed up color development, improve coloring of the developed image, and to make the image glossy. Ordinary electrophotography employs a thermal fixing device comprising a heating roll and a pressing roll for sandwiching a recording sheet therebetween while heating the same. The thermal fixing device in electrophotographic apparatus requires electric power of at least 900 W. Since, however, a recording apparatus using a photosensitive and pressure-sensitive recording sheet consumes a large amount of electric power for exposure only, the exposure and thermal fixing devices of such a recording apparatus could not be simultaneously energized by a home-use electric power supply.

There has been devised a thermal fixing device using the exposure light source as a heat source for heating the color developer sheet through heat radiation. While such a thermal fixing device is advantageous in that no new separate heat source is required, it is disadvantageous in that a long period of time is needed to thermally fix the image since the heat radiation from the exposure lIght source is low in efficiency. In addition, designing the entire system in order to position the exposure light source and the thermal fixing zone closely to each other has been subject to limitations

SUMMARY OF THE INVENTION

It is an object of the present invention to provide an image recording apparatus including a thermal fixing device capable of thermally fixing a developed image on a color developer sheet stably within a short period of time.

Another object of the present invention is to provide an image recording apparatus including a thermal fixing device capable of thermally fixing a developed image on a color developer sheet by utilizing heat generated from an exposure light source.

In order to attain the above and other objects, the present invention provides an image recording apparatus including an exposure light source, a pressure developing device and a thermal fixing device. The exposure light source exposes a photosensitive and pressure-sensitive recording sheet to a light through an image carrying medium to form a latent image thereon. The pressure developing device performs pressure development of the latent image on the photosensitive and pressure-sensitive recording sheet into a visible image. The visible image is formed on the same sheet or a separate sheet. The thermal fixing device performs thermal fixing of the visible image on the sheet, which comprises a heat storing/radiating means disposed between the exposure light source an the sheet on which the visible image is formed for storing the heat generated by the exposure light source and radiating the heat stored therein toward the sheet for thermally fixing the visible image thereon.

The above and other objects, features and advantages of the present invention will become more apparent from the following description hen taken n conjunction with the accompanying drawings in which preferred embodiments of the present invention are shown by way of illustrative example.

DETAILED DESCRIPTION OF THE PREFERRED EMBODIMENTS

Figure 1:
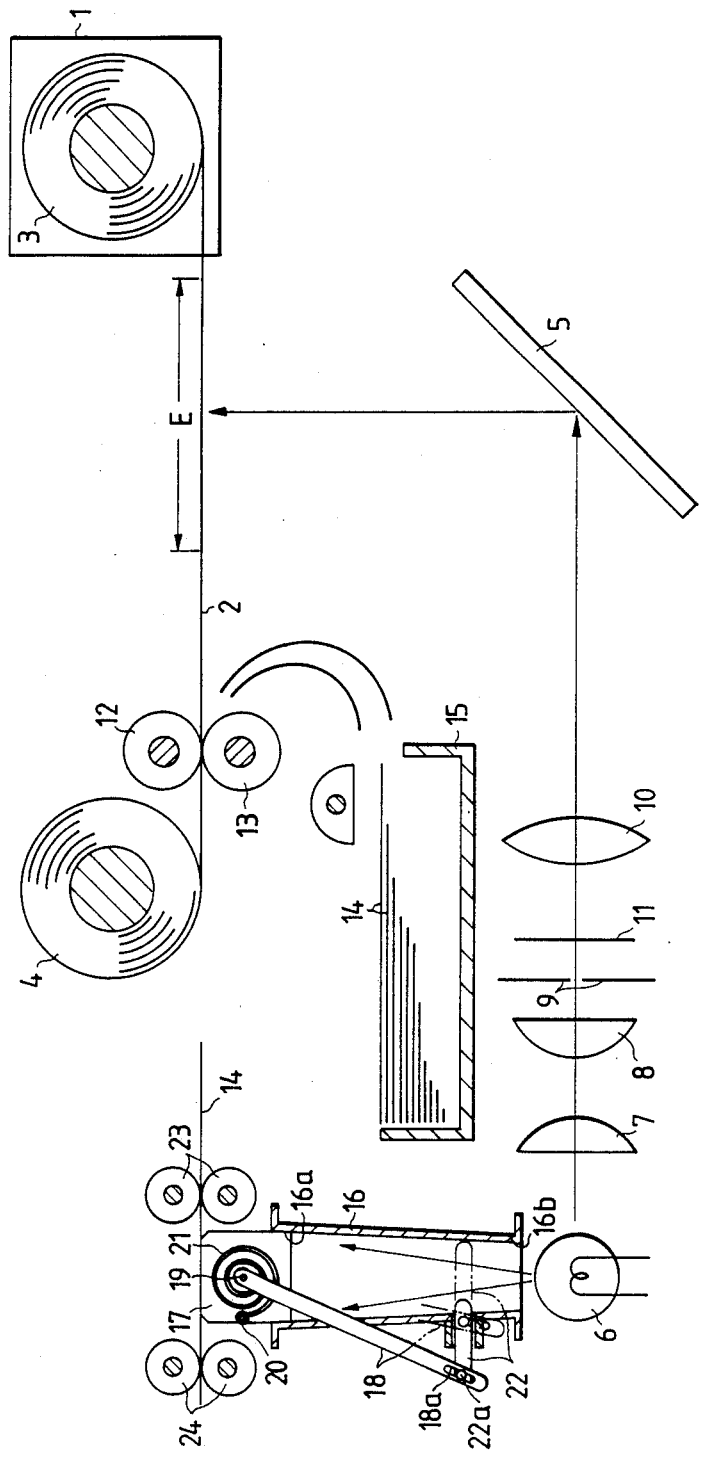
FIG. 1 is a schematic side elevational view, partly in cross section, of an image recording apparatus according to an embodiment of the present invention.

As shown in FIG. 1, an image recording apparatus or copying apparatus has a light-shielding case 1 housing a supply roll 3 of a photosensitive and pressure-sensitive recording sheet 2. The supply roll 3 is rotatable intermittently about its own axis in timed relation to a takeup roll 4 by a drive unit (not shown) for withdrawing the photosensitive and pressure-sensitive recording sheet 2 from the case 1 into an exposure zone E. The photosensitive and pressure-sensitive recording sheet 2 is coated on one surface thereof (lower surface in FIG. 1) with photocuring microcapsules encapsulating dye pr cursors. Underneath the exposure zone E, there are disposed an exposure reflecting mirror 5 inclined 45° with respect to the path along which the photo-sensitive pressure-sensitive recording sheet 2 is supplied, and an exposure light source 6 comprising a halogen lamp disposed laterally of the reflecting mirror 5. Between the exposure light source 6 and the reflecting mirror 5, there are disposed a pair of condenser lenses 7, 8, a shutter 9 which is selectively openable and closable in timed relation to an exposure cycle, and a projection lens 10. A slide film 11 is interposed between the shutter 9 and the projection lens 10. When the exposure light source 6 is energized, the microcapsules on the photosensitive and pressure-sensitive recording sheet in the exposure zone E are selectively photocured by exposure to light having passed through the slide film 11, so that the image on the slide film 11 will be recorded as a pattern of photocured microcapsules on the photosensitive and pressure-sensitive recording sheet 2.

The photosensitive and pressure-sensitive recording sheet 2 is then fed from the exposure zone E along a path toward the takeup roll 4. A pair of upper and lower pressure developing rollers 12, 13 are rotatably disposed one on each side of the path o the photosensitive and pressure-sensitive recording sheet 2. The pressure developing rollers 12, 13 are driven by a drive unit (not shown) to rotate about their own axes in timed relation to the intermittent movement of the photosensitive and pressure-sensitive recording sheet 2. A sheet cassette 15 storing a stack of color developer sheets 14 is disposed below the pressure developing rollers 12, 13. One, at a time, of the color developer sheets 14 is fed from the sheet cassette 15 into overlapping relation to the microcapsule-coated surface of the photosensitive and pressure-sensitive recording sheet 2 in timed relation to the intermittent travel of the photosensitive and pressure-sensitive recording sheet 2.

The photosensitive and pressure-sensitive recording sheet 2 which has been exposed to light from the exposure light source 6 is superposed on the color developer sheet 14 and fed in between the prressure developing rollers 12, 13, whereupon the sheets 2, 14 are pressed against each other by the pressure developing rollers 12, 13. Those microcapsules in the area of the photosensitive and pressure-sensitive recording sheet 2 which has not been exposed to light are ruptured to allow the dye precursors to flow out of the ruptured microcapsules and react with the color developer on the color developer sheet 14, to develop the latent image formed on the photosensitive and pressure-sensitive recording sheet 2 into a visible image and transfer the visible image onto the color developer sheet 14.

Above the exposure light source 6, there is a heat collecting tube 16 extending vertically and having an upper opening 16a in which a heat storing/radiating medium 17 in the form of an aluminum block is fitted. Heat radiation from the exposure light source 6 is introduced from a lower opening 16b of the heat collecting tube 16 and stored in the heat storing/radiating medium 17. Two guide roller pairs 23, 24 are disposed in front of and behind the heat storing/radiating medium 17 for guiding a color developer sheet 14 carrying thereon a developed image. The heat storing/radiating medium 17 has an upper surface lying in the path along which the color developer sheet 14 is fed between the guide roller pairs 23, 24. A lever 18 is pivotally coupled at one end to a side of the heat storing/radiating medium 17 by means of a pin 19. A spiral bimetallic element 21 disposed around the pin 19 is connected between the upper end portion of the lever 18 and a pin 20 mounted on the side of the heat storing/radiating medium 17. A shutter 22 is mounted on one side of the heat collecting tube 16 for horizontal movement into and out of the heat collecting tube 16. The lever 18 has a lower end coupled to an outer end of the shutter 22 by means of a guide pin 22a fixed to the shutter 22 and loosely fitted in a guide slot 18a defined in the lower end of the lever 18.

The photosensitive and pressure-sensitive recording sheet 2 which has been pressed in overlapping relation to the color developer sheet 14 is wound on the takeup roll 4, whereas the color developer sheet 14 is fed into the path between the guide rollers 23, 24. The color developer sheet 14 is guided by the guide rollers 23, 24 while being held in contact with the upper surface of the heat storing/radiating medium 17 which stores heat radiated from the exposure light source 6, whereupon the heat stored in the heat storing/radiating medium 17 is conducted directly to the color developer sheet 14. Since aluminum, of which the heat storing/radiating medium 17 is made, has sufficiently high thermal capacity and thermal conductivity, the heat radiated from the exposure light source 6 can be absorbed by the heat storing/radiating medium 17 highly efficiently. The heat storing/radiating medium 17 can store an amount of heat which is large enough to heat the color developer sheet 14, and can be heated up to a desired temperature within a short period of time. Therefore, the image on the color developer sheet 14 can stably be thermally fixed without employing another separate heat source, and the time of a thermal fixing cycle is reduced.

The temperature of the heat storing/radiating medium 17 is sensed by the spiral bimetallic element 21, which is deformed in response to a change in the temperature of the heat storing/radiating medium 17 for tilting the lever 18 about the pin 19 to control the amount by which the shutter 22 projects into the heat collecting tube 16. Thus, if the temperature of the heat storing/radiating medium 17 is increased, the shutter 22 projects a greater length into the heat collecting tube 16. If the temperature of the heat storing/radiating medium 17 goes lower, then the shutter 22 is moved in a direction out of the heat collecting tube 16 Consequently, the temperature of the heat storing/radiating medium 17 can be maintained at a level which is suitable for thermally fixing the image on the color developer sheet 14. The bimetallic element 2 for moving the lever 18 in response to a change in the temperature of the heat storing/radiating medium 17 may be replaced with an element made of shape memory alloy, or alternatively, the bimetallic element 21 may be dispensed with and the lever 18 itself may be made of shape memory alloy.

The heat storing/radiating medium 17 may be of a hollow structure having a downward opening. The heat storing/radiating medium 17 be made of copper, ceramics, or the like which has high thermal capacity and conductivity, or may be made of a combination of aluminum which is high in thermal capacity and copper which is high in thermal conductivity.

The heat storing/radiating medium 17 may be positioned in slightly spaced relation to the color developer sheet 14 which is guided between the guide rollers 23, 24 for heatinbg the color developer sheet 14 through heat radiation without direct contact between the heat storing/radiating medium 17 and the color developer sheet 14. Alternatively, the heat storing/radiating medium 17 may be in the form of a roller.

Figure 2:
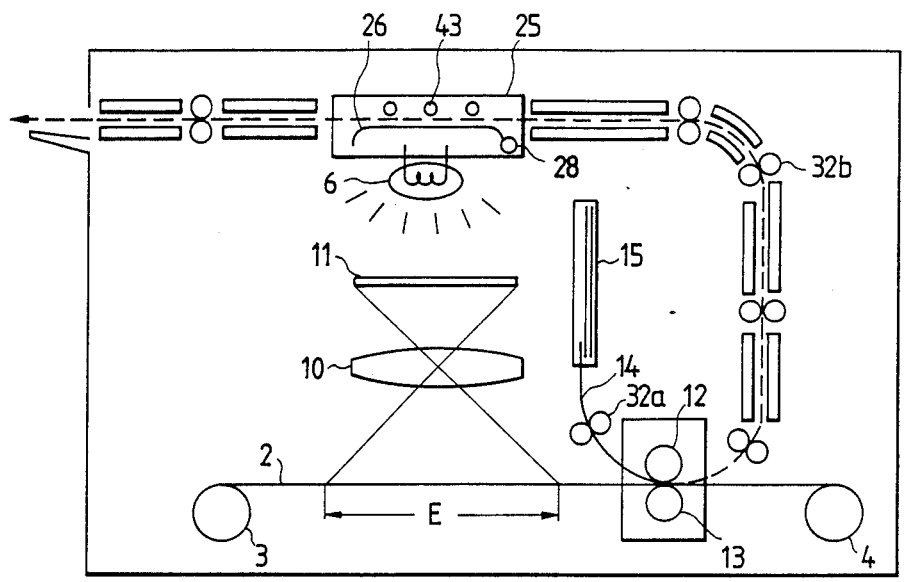
FIG. 2 is a schematic side elevational view of an image recording apparatus according to another embodiment of the present invention.
Figure 3:
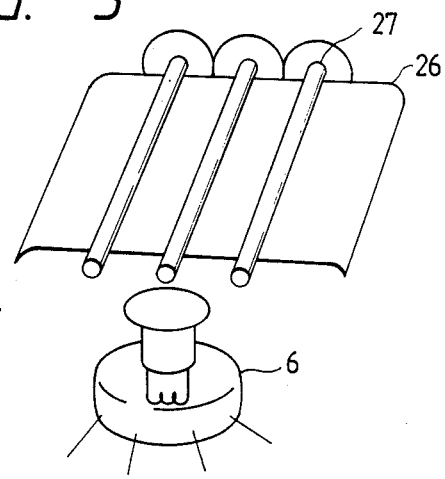
FIG. 3 is a perspective view of a thermal fixing device in the image recording apparatus shown in FIG. 2.
Figure 4:
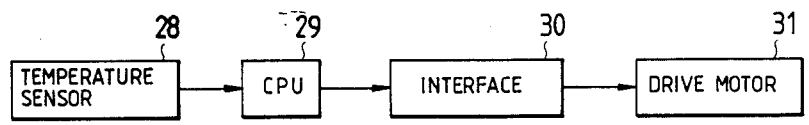
FIG. 4 is a block diagram of a control system of the recording apparatus of FIG. 2.

FIGS. 2 through 4 show an image recording apparatus according to another embodiment of the present invention, in which like reference numerals designate like components as those shown in FIG. 1.

As shown in FIG. 2, the image recording apparatus includes a sheet roll 3 of a photosensitive and pressure-sensitive recording sheet 2, which is fed to a takeup roll 4 through an exposure zone E and pressure developing rollers 12, 13. The photosensitive and pressure-sensitive recording sheet 2 is exposed to image information bearing light. Above the exposure zone E, there are disposed a thermal fixing device 25, an exposure light source 6, a slide film 11 carrying an image to be recorded, and an optical projection lens 10. As illustrated also in FIG. 3, the pressure fixing device 25 includes a reflecting mirror 26 positioned upwardly of the exposure light source 6 and a plurality of feed rollers 27 positioned on and urged lightly against the upper surface of the reflecting mirror 26. The feed rollers 27 are rotatable clockwise about their own axes at a constant speed. A temperature sensor 28 is connected to the reflecting mirror 26. As shown in FIG. 4, the temperature sensor 28 produces a signal representative of the sensed temperature which in turn is supplied to a CPU 29. The CPU 29 applies a control signal via an Interface 30 to a drive motor 31 that rotates the feed rollers 27. In response to the control signal the speed of rotation of the feed rollers 27 is controlled.

When the light source 6 is energized, the image on the slide film 11 is formed on the photosensitive and pressure-sensitive recording sheet 2 via the projection lens 10 to form a latent image on the sheet 2. The photosensitive and pressure-sensitive recording sheet 2 is then fed to a nip between the pressure developing rollers 12, 13, and at the same time a color developer sheet 14 supplied from a sheet cassette 15 is fed by a sheet feeder 32a into the nip between the pressure developing rollers 12, 13 in overlapping relation to the photosensitive and pressure-sensitive recording sheet 34. The latent image is developed into a visible image under pressure, which is transferred onto the color developer sheet 14 by the pressure fixing rollers 12, 13. The color developer sheet 14 is then delivered by a sheet feeder 32b into the thermal fixing device 25.

In FIG. 3, the color developer sheet 14 with its image carrying surface facing up is passed between the feed rollers 28 and the reflecting mirror 26 which stores heat by being heated by the exposure light source 6, during which time the image on the color developer sheet 16 is thermally fixed. The speed at which the color developer sheet 16 is fed by the feed rollers 27 is controlled by the CPU 29 as described above. More specifically, the speed of travel of the color developer sheet 16 is expressed by the following equation:

$$S = l/(-0.02t + 3)$$

where S represents the speed of travel of the color developer sheet mm/sec.); l, the length of the reflecting mirror in the direction in which the color developer sheet is fed (mm); and t, the temperature of the reflecting mirror (°C.).

The speed S at which the color developer sheet 14 is to be fed is calculated by the CPU 29 according to the above equation. Then, the CPU 29 produces a control signal which is applied via the interface 30 to the drive motor to control the speed of travel of the color developer sheet 14. The reflecting mirror 26 is heated to a temperature ranging from 50° C. to 130° C.

Even when the temperature of the reflecting mirror 26 has not yet reached 50° C., the light source 6 may be energized. In this case, the exposure light source 6 and the reflecting mirror 26 may be turned together by 180° or upside down while retaining their relative positional relationship, and the color developer sheet 14 may be passed therebetween so that it can be heated efficiently by both the light source 6 and the reflecting mirror 26.

The reflecting mirror 26 may be associated with an auxiliary heating means such as a Nichrome wire for additionally heating the color developer sheet 14 with electric power. The photosensitive and pressure-sensitive recording sheet 2 may be of a self-contained type which is capable developing colors by itself. Such a self-contained type recording sheet is disclosed in U.S. Pat. No. 4,440,846 to Sanders et al. Briefly, in the self-contained type recording sheet, an encapsulated chromogenic material or dye precursor and a developer material are co-deposited on one surface of a single substrate as one layer or as two contiguous layers.

With the arrangement of the present invention, since heat from the exposure light source is stored and utilized for thermally fixing the image on the color developer sheet through direct or substantially direct contact between the color developer sheet and the heat applying means which may be the heat storing/radiating medium 17 of FIG. 1 or the reflecting mirror 26 of FIG. 2. Therefore, no separate heat source is necessary for heating the color developer sheet, the time required for heating the color developer sheet is reduced, and the image can stably be fixed. Moreover, as the waste energy of he exposure light source is used for thermally fixing the image on the color developer sheet, the total amount of energy consumed by the image recording apparatus can be saved. The size and weight of the image recording apparatus are reduced as no separate heat source is required.

Although certain preferred embodiments have been shown and described, it should be understood that many changes and modifications may be made therein without departing from the scope of the appended claims.

What is claimed is:

1. In an image recording apparatus including an exposure light source for exposing a photosensitive and pressure-sensitive recording sheet to an image bearing light to form a latent image thereon, said exposure light source generating heat, and a pressure developing device for pressure developing said latent image on said photosensitive and pressure-sensitive recording sheet into a visible image and transferring said visible image onto a color developer sheet, a thermal fixing device for thermally fixing said visible image on said color developer sheet, said thermal fixing device comprising:

a heat storing/radiating means disposed between said exposure light source and said color developer sheet on which said visible image is formed, in substantial contact with said color developer sheet, for storing said heat generated by said exposure light source and radiating said heat stored therein toward said color developer sheet for thermally fixing said visible image thereon;

a heat collecting means disposed between said exposure light source and said heat storing/radiating means for collecting said heat generated by said exposure light source, the heat collected by said heat collecting means being applied to said heat storing/radiating means;

a temperature sensing means for sensing a temperature of said heat storing/radiating means and producing a temperature signal representative of said temperature of said heat storing/radiating means; and a heat amount control means responsive to said temperature signal for controlling an amount of heat applied to said color developer sheet to be maintained substantially constant, said temperature sensing means comprising a bimetallic element thermally coupled to said heat storing/radiating means and deformable in accordance with a temperature change in said heat storing/radiating means; said heat amount control means comprising a shutter means provided in said heat collecting means and operable in response to said deformation of said bimetallic element to control an amount of heat collected by said heat collecting means.

2. A thermal fixing device as set forth in claim 1, wherein said heat storing/radiating means comprises a block-shaped massive member.

3. A thermal fixing device as set forth in claim 2, wherein said massive member is made of aluminum.

4. A thermal fixing device as set forth in claim 2, wherein said massive member is made of copper.

5. A thermal fixing device as set forth in claim 2, wherein said massive member is made of ceramics.

6. The thermal fixing device as set forth in claim 1, wherein said photosensitive and pressure-sensitive recording sheet is coated with pressure-rupturable microcapsules containing therein dye precursours, a mechanical strength of said microcapsule being variable upon exposure to light, and wherein said color developer sheet is coated with a color developer which reacts with said dye precursours flowing out of the ruptured microcapsules when said latent image on said photosensitive and pressure-sensitive recording sheet is subjected to pressure development.

7. In an image recording apparatus including an exposure light source for exposing a photosensitive and pressure-sensitive recording sheet to an image bearing light to form a latent image thereon, said exposure light source generating heat, and a pressure developing device for pressure developing said latent image into a visible image, a thermal fixing device for thermally fixing said visible image on said sheet, said thermal fixing device comprising a heat storing/radiating means disposed between said exposure light source and said sheet on which said visible image is formed, in substantial contact with said color developer sheet, for storing said heat generated by said exposure light source and radiating said heat stored therein toward said sheet for thermally fixing said visible image thereon;

a heat collecting means disposed between said exposure light source and said heat storing/radiating means for collecting said heat generated by said exposure light source, the heat collected by said collecting means being applied to said heat storing/radiating means;

a temperature sensing means for sensing a temperature of said heat storing/radiating means and producing a temperature signal representative of said temperature of said heat storing/radiating means; and a heat amount control means responsive to said temperature signal for controlling an amount of heat applied to said sheet to be maintained substantially constant, said temperature sensing means comprising a bimetallic element thermally coupled to said heat storing/radiating means and deformable in accordance with a temperature change in said heat storing/radiating means; said heat amount control means comprising shutter means provided in said heat collecting means and operable in response to said deformation of said bimetallic element to control an amount of heat collected by said heat collecting means.

8. A thermal fixing device as set forth in claim 7, wherein said heat storing/radiating means comprises a block-shaped massive member.

9. A thermal fixing device as set forth in claim 8, wherein said massive member is made of aluminum.

10. A thermal fixing device as set forth in claim 8, wherein said massive member is made of copper.

11. A thermal fixing device as set forth in claim 8, wherein said massive member is made of ceramics.

12. A thermal fixing device as set forth in claim 7, wherein said photosensitive and pressure-sensitive recording sheet comprises a substrate, pressure-rupturable microcapsules coated on one surface of said substrate, said microcapsules containing therein dye precursours, and a developer material co-deposited on said one surface as one layer.

13. A thermal fixing device as set forth in claim 7, wherein said photosensitive and pressure-sensitive recording sheet comprises a substrate, pressure-rupturable microcapsules coated on one surface of said substrate, said microcapsules containing therein dye precursours, and a developer material co-deposited on said one surface as two contiguous layers.

14. In an image recording apparatus including an exposure light source for exposing a photosensitive and pressure-sensitive recording sheet to an image bearing light to form a latent image thereon, said exposure light source generating heat, and a pressure developing device for pressure developing said latent image on said photosensitive and pressure-sensitive recording sheet into a visible image and transferring said visible image onto a color developer sheet, a thermal fixing device for thermally fixing said visible image on said color developer sheet, said thermal fixing device comprising:

a heat storing/radiating means disposed between said exposure light source and said color developer sheet on which said visible image is formed, in substantial contact with said color developer sheet, for storing said heat generated by said exposure light source and radiating said heat stored therein toward said color developer sheet for thermally fixing said visible image thereon;

a heat collecting means disposed between said exposure light source and said heat storing/radiating means for collecting said heat generated by said exposure light source, the heat collected by said heat collecting means being applied to said heat storing/radiating means;

a temperature sensing means for sensing a temperature of said heat storing/radiating means and producing a temperature signal representative of said temperature of said heat storing/radiating means; and a heat amount control means responsive to said temperature signal for controlling an amount of heat applied to said color developer sheet to be maintained substantially constant, said temperature sensing means comprising a shape memory alloy element thermally coupled to said heat storing/radiating means and deformable in accordance with a temperature change in said heat storing/radiating means; said heat amount control means comprising a shutter means provided in said heat collecting means and operable in response to said deformation of said shape memory alloy element to control an amount of heat collected by said heat collecting means.

15. In an image recording apparatus including an exposure light source for exposing a photosensitive and pressure-sensitive recording sheet to an image bearing light to form a latent image thereon, said exposure light source generating heat, and a pressure developing device for pressure developing said latent image on said photosensitive and pressure-sensitive recording sheet into a visible image and transferring said visible image onto a color developer sheet, a thermal fixing device for thermally fixing said visible image on said color developer sheet, said thermal fixing device comprising:
- a heat storing/radiating means disposed between said exposure light source and said color developer sheet on which said visible image is formed, in substantial contact with said color developer sheet, for storing said heat generated by said exposure light source and radiating said heat stored therein toward said color developer sheet for thermally fixing said visible image thereon;
- a heat collecting means disposed between said exposure light source and said heat storing/radiating means for collecting said heat generated by said exposure light source, the heat collected by said heat collecting means being applied to said heat storing/radiating means;
- a temperature sensing means for sensing a temperature of said heat storing/radiating means and producing a temperature signal representative of said temperature of said heat storing/radiating means; and a heat amount control means responsive to said temperature signal for controlling an amount of heat applied to said color developer sheet to be maintained substantially constant,
- said heat amount control means comprising at least one feed roller for feeding said color developer sheet, and a drive motor for rotating said feed roller, wherein a rotational speed of said feed roller is controlled in response to said temperature signal.

16. A thermal fixing device as set forth in claim 15, wherein said heat storing/radiating means comprises a plate-like member, wherein said color developer sheet is travelled by said feed roller while being in sliding contact with said plate-like member.

17. In an image recording apparatus including an exposure light source for exposing a photosensitive and pressure-sensitive recording sheet to an image bearing light to form a latent image thereon, said exposure light source generating heat, and a pressure developing device for pressure developing said latent image into a visible image, a thermal fixing device for thermally fixing said visible image on said sheet, said thermal fixing device comprising:
- a heat storing/radiating means disposed between said exposure light source and said sheet on which said visible image is formed for storing said heat generated by said exposure light source and radiating said heat stored therein toward said sheet for thermally fixing said visible image thereon;
- a heat collecting means disposed between said exposure light source and said heat storing/radiating means for collecting said heat generated by said exposure light source, the heat collected by said heat collecting means being applied to said heat storing/radiating means;
- a temperature sensing means for sensing a temperature of said heat storing/radiating means and producing a temperature signal representative of said temperature of said heat storing/radiating means; and a heat amount control means responsive to said temperature signal for controlling an amount of heat applied to said sheet to be maintained substantially constant,
- said temperature sensing means comprising a shape memory alloy element thermally coupled to said heat storing/radiating means and deformable in accordance with a temperature change in said heat storing/radiating means; said heat amount control means comprising a shutter means provided in said heat collecting means and operable in response to said deformation of said shape memory alloy element to control an amount of heat collected by said heat collecting means.

18. In an image recording apparatus including an exposure light source for exposing a photosensitive and pressure-sensitive recording sheet to an image bearing light to form a latent image thereon, said exposure light source generating heat, and a pressure developing device for pressure developing said latent image into a visible image, a thermal fixing device for thermally fixing said visible image on said sheet, said thermal fixing device comprising:
- a heat storing/radiating means disposed between said exposure light source and said sheet on which said visible image is formed for storing said heat generated by said exposure light source and radiating said heat stored therein toward said sheet for thermally fixing said visible image thereon;
- a heat collecting means disposed between said exposure light source and said heat storing/radiating means for collecting said heat generated by said exposure light source, the heat collected by said heat collecting means being applied to said heat storing/radiating means;
- a temperature sensing means for sensing a temperature of said heat storing/radiating means and producing a temperature signal representative of said temperature of said heat storing/radiating means; and a heat amount control means responsive to said temperature signal for controlling an amount of heat applied to said sheet to be maintained substantially constant,
- said heat amount control means comprising at least one feed roller for feeding said sheet, and a drive motor for rotating said feed roller, wherein a rotational speed of said feed roller is controlled in response to said temperature signal.

19. A thermal fixing device as set forth in claim 8, wherein said heat storing/radiating means comprises a plate-like member, wherein said sheet is travelled by said feed roller while being in sliding contact with said plate-like member.

* * * * *